United States Patent [19]
Henig

[11] Patent Number: 5,167,779
[45] Date of Patent: Dec. 1, 1992

[54] PROCESS AND APPARATUS FOR ELECTROLYTE EXCHANGE

[76] Inventor: Hans J. Henig, Albrecht Achilles Str. 48, Nürnberg, Fed. Rep. of Germany, 8500

[21] Appl. No.: 569,124

[22] Filed: Aug. 17, 1990

[51] Int. Cl.⁵ .............................................. C25D 5/00
[52] U.S. Cl. .................... 204/140; 205/149; 205/150; 204/201; 204/222; 204/214
[58] Field of Search ............... 204/222, 285, 201, 214, 204/287, 140, 24, 27; 205/149, 150

[56] References Cited

U.S. PATENT DOCUMENTS

| | | | |
|---|---|---|---|
| 2,697,689 | 12/1954 | Barr et al. | 204/222 |
| 4,229,276 | 10/1980 | Kobayashi et al. | 204/222 |
| 4,508,396 | 4/1985 | Doi et al. | 204/37.1 |
| 4,726,884 | 2/1988 | Sawa | 204/24 |
| 4,883,575 | 11/1989 | Yasuno et al. | 204/203 |

FOREIGN PATENT DOCUMENTS

4853763  1/1975  Japan ................... 204/222

Primary Examiner—John Niebling
Assistant Examiner—Arun S. Phasge
Attorney, Agent, or Firm—Fleit, Jacobson, Cohn, Price, Holman & Stern

[57] ABSTRACT

A process and apparatus for obtaining an intensive and continuous exchange of electrolyte on the surfaces of workpieces (11, 21) subjected to chemical or electrolytical treatments wherein the exchange is achieved by subjecting the workpieces (11, 21) to strong pulsating oscillations of a frequency of at least 1 Hz and of an amplitude of less than 10 mm, when immersed in the electrolyte. The vibrations are transmitted from an oscillation generator (3) mounted on a workpiece carrier, such as a rack (1, 4) or a rotating dipping drum 92). These high frequency low amplitude oscillations may be combined with low frequency, relatively long oscillations (7, 9, 10, 18), occurring simultaneously. The oscillation generator (3) is arranged on the individual transportable workpiece carriers (1, 2, 14). The workpieces may be boards (11) for printed circuits having through holes (12) or a pourable mass of parts (21).

20 Claims, 8 Drawing Sheets

PROCESS AND APPARATUS FOR ELECTROLYTE EXCHANGE

BACKGROUND OF THE INVENTION

1. Field of the Invention

The invention is concerned with a process and apparatus for the continuous exchange of aqueous solutions during a chemical or electrolytic treatment on a surface. The invention finds particular, but not exclusive, application to the treatment of narrow surface depressions (such as within a bore) in a large surface or on individual work-pieces or the treatment of a pourable loose mass (charge) of work-pieces of metals or plastics.

2. Description of the Prior Art

It is known that an electrolytic reduction process on cathodic polarized work-pieces proceeds in the very thin liquid layer lying immediately on the exposed surfaces. The thickness of these catholyte films is very small, typically 500 $\mu$m with stationary and 10 $\mu$m with agitated cathodes (for example, with a relative velocity of 3.25 m/min between the work-piece and the treatment solution). Streams outside this zone have no influence on the reactions in the electrolytically-active boundary layer.

Through reduction, the catholyte becomes poorer in metal ions. The deficiency in ions cannot be balanced out sufficiently quickly through diffusion, natural convection or migration of the electric charge carriers. This deficiency appears more strongly with high current densities.

Operational experience teaches that through an increase in the relative velocity between the surface of the cathode and the surrounding electrolyte the permissible cathode current density and yield rise practically proportionally. The tinning of copper wire can serve as an example. The very rapid passage of a wire through an electrolyte (with a transport speed of 600 to 1300 m/min) causes a massive turbulence on the surface with a correspondingly rapid electrolyte exchange and possible current densities of 32 to 97 A/dm$^2$.

In the known installations for manufacturing printed circuit boards having track-connecting through-holes, the boards are moved at a low frequency of about 30 oscillations per minute and with an amplitude of 20 to 60 mm horizontally, in order to bring about the necessary electrolyte exchange in the drilled holes and at the same time to remove hydrogen bubbles. The holes between the conductor tracks generally have a very small diameter (for example from 0.8 to 1.2 mm) and may be present in large numbers (for example 25,000 to 90,000 drillings per m$^2$). The development tendency in the production of conductor tracks is constantly towards narrower conductor paths, smaller distances between conductors, smaller connecting through-holes and thicker boards. A board of 7.3 mm thickness with drilled holes of 0.35 mm diameter, and thus with a hole ratio of 21:1 can serve as an example.

In view of the very long work-piece linear movement paths, the low speeds and the gentle reversal processes in the known installations, it is obvious that the electrolyte quantities, confronting the large area flat boards, in fact oscillate together in the same rhythm with the boards and thus the relative speeds come to a condition which proves not to be sufficiently large for an effective electrolyte exchange, in particular in the drilled holes. For this reason it has been proposed to intensify the hole treatment with a forced through-flow generated by ultrasonics. Resorting to ultrasonics means a reversal in principle of the previously described systems generally employed, in order to obtain an electrolyte exchange on the surface of the work-piece. In this way, the fluid boundary layer is set in motion against the surface of the work-piece. The frequency of the ultra-sound lies above a threshold of about 10 kHz. It is known that in electrolytic metal-deposition, ultra-sound fields cause a strong agitation of the electrolyte in the fluid boundary layer, and through this bring about a rapid concentration balance. However, the use of ultra-sound in metal deposition on conductor boards breaks down principally because the very thin (copper) layers at first chemically deposited on the surfaces of the synthetic conductor-boards (from about 0.35 $\mu$m to about 8 $\mu$m thick) only adhere thereto in a limited way and a liquid put into oscillation during the tension-phase of the sound-wave—depending on the frequency, amplitude and intensity—leads to the tearing away of the already reduced copper layer from hollow spaces (cavitation effects) on the board surfaces. These effects occur in particular when—as an accompanying effect of the reduction process—hydrogen bubbles appear.

Homogeneous, sufficiently exactly controllable sound-fields in liquids can be established only with an extraordinarily high apparatus cost; installations with ultra-sound-boards and dipping oscillators are therefore hardly available for commercial practice.

A similar process for the electrolyte exchange, and in fact to move the treatment solution against the conductor boards and not the other way round, has become known as a 'horizontal through-flow process'. The individual solution containers are closed with a cover. The conductor boards are transported horizontally from one treatment station (tank) to the next: during the stay of a board in the individual stations the treatment solution is pumped out of a storage container and forced through flow-pipes on to the horizontally moving conductor boards. This leads to an intensified electrolyte exchange, in particular giving a forced flow through the holes in the conductor boards. Finally, the solutions flow by way of a catchment tank back again into the storage container.

In comparison with the conventional installations, which treat the conductor boards in a vertical position, the installations in the horizontal through-flow process are correspondingly longer and effectively more complicated in their technical installation construction. Their defects are obvious: greater space requirement, higher installation costs, increased electro-mechanical failure liability and corresponding maintenance costs.

The horizontal system also excludes the treatment of the conductor boards in a so-called batch process, in which a parallel arrangement of a number of conductor-boards on a single structure go through the whole treatment process simultaneously.

A problem similar to that which arises with the conductor boards occurs in the surface treatment of a mass of pourable parts in a dipping drum. The continually decreasing diameter of the drill holes in the conductor boards and their greater packing density lead inevitably to the diameter of the inserts for the tracks becoming ever smaller. If such components are provided also with tube-like recesses or blind holes, then these can hardly be chemically or electrolytically treated with the known dipping drums rotating about their longitudinal axes. Apart from lack of solution exchange in the walls of the bores, there often occurs the condition that through an insufficient capillary action, there is no solution at all in the bores.

Generally, a drum has a regular geometrical cylindrical form and turns about its horizontal axis of rotation, which is also at the same time its longitudinal and symmetrical axis. From the standpoint of the flow mechanics the rotating drum can be regarded as a hydraulically smooth body, which means that hardly any flow of the electrolyte takes place through the perforated drum wall. It is similarly known that the compact irregularly assembled mass of the drum-load electrically resembles a Faraday cage and that the electrolytic reduction process proceeds only on the periphery of the load. The deficient solution exchange inside the load leads additionally to the so-called depth distribution of the electrolyte reducing similarly, and the mass of parts is unequally treated with a correspondingly high reject rate.

The advantages of causing vibration oscillations in the electrolytic surface treatment of mass parts and a number of devices for making use of this process are known. The constant relative movement of the load as a whole caused by the vibration against the surrounding electrolyte proceeds continuously to all individual parts in the mass with a similar intensity, irrespective of their instantaneous position inside the load.

The known appliances consist in effect of a circular, horizontally supported plate-like dish, open above and dipping into the electrolyte, which receives the load, there being a centrally-supported vertical bearing-shaft on the dish, and a vibrator with its support structure. The dish and the heavily-loaded vibrator are on the vertical extremities of the device. The bearing-shaft transfers both the oscillations from the vibrator and also the electric current to the load in the dish. A cylindrical wall surrounds the spirally-formed base of the dish, in order to prevent the mass parts from falling out. The dish does not execute any rotational movement about the support shaft. The vibrator produces a throwing movement for the load mass, in that it oscillates the dish reversibly both vertically and also at the same time about the support shaft as a center (forward-upward and back-downward). The forward and backward processes of the diagonally upward directed throwing movement have the same time duration. Through this, the load lying on the dish is set into a flowing movement: it climbs—jumping—up the spirally formed bottom of the dish as a ramp, then falls down thoroughly mixed from its radially directed edge.

In view of this, the charge circulates, jumping as a whole unit, without becoming mixed together, circularly about the support column of the round dish: the mixing process takes place only locally and over an extremely short time on the edge of the ramp.

The previously described thorough mixing process of the load is one of the decisive disadvantages of the known equipment. The individual mass parts change their relative positions only very little; an individual part moves much more in relatively equal circular paths about the central column as a middle point. The mass parts in the peripheral plate-circumference of the load experience in this a considerably higher cathodic current density (as a result of their shorter distance to the anodes) than those which circulate in the central region of the support shaft. The electrolytic deposition consequently takes place unevenly on the load as a whole. In order nevertheless to arrive at a layer having as even as possible thickness distribution, only very low plating currents are permissible: this circumstance leads inevitably to unusually long, uneconomical treatment times.

BRIEF SUMMARY OF THE INVENTION

A principal object of the invention is to solve the problem of making possible an effectively increased current density for the rapid deposition of even and pore-free metal, through an intensive electrolyte exchange directly at the boundary surface of work-pieces.

A further object is to allow the plating of narrow recesses or through-bores with uniform deposition thicknesses along the length of such bores.

Yet another object of this invention is to provide a process which greatly increases the average relative movement speed between a work-piece and an electrolyte in which that work-piece is immersed, to enhance bubble dissipation and ion exchange.

The invention has as a further object a process and apparatus specifically adapted for the manufacture of planar articles such as printed circuit boards having conducting tracks on both sides thereof and which are to be interconnected by plated through-holes of small diameters.

Another object is to provide a process and apparatus adapted for the chemical or electrolytic treatment of a bulk mass of pourable parts contained within a perforate dipping drum, wherein uniform plating may be achieved on all parts in the mass.

In accordance with these and other objects, this invention provides that:

a) work-pieces of large-area shape, in particular flat planes, such as vertically or horizontally hanging conductor boards for printed circuits with numerous through-holes, are fixed rigidly on special so-called racks, or work-pieces to be dipped are filled loosely as a charge of pourable mass-parts in a dipping drum which is fully closed on all sides and rotatable about its effective lengthwise axis; and b) the carriers, including the work-pieces fixed rigidly on the said racks or loose inside the said dipping drums, carry out strong pulsating vibration oscillations in the treatment solution, of which the (circular) frequencies are greater than 1 Hz and the (vibration) amplitude is less than 10 mm.

The invention also provides apparatus suitable for performing the method herein, to permit the production of superior plated parts or other work-pieces.

BRIEF DESCRIPTION OF THE DRAWINGS

In order that the invention may better be understood, it will now be described in greater detail, and certain specific embodiments and preferred aspects thereof will be presented by way of example with reference to the accompanying drawings wherein.

DETAILED DESCRIPTION OF THE PREFERRED EMBODIMENTS

The term "work-piece" is used herein to indicate for example all types of conductor boards for printed circuits as well as all types of pourable mass parts, which may be loaded for treatment in so-called dipping drums. The dipping drums are closed containers of cylindrical or prismatic form, which have a perforated casing and rotate about their horizontal long axes. The loading or unloading of the charge takes place through a closable opening with a removable cover, provided on one side of the casing of the drum-cylinder. As regards conductor-boards, these may be fixed on so-called frames (in a corresponding frame carrier) at the time of the treatment. The conductor-board carrier, for example a frame, or the carrier for a charge, for example a dipping drum, are generally called work-piece carriers.

According to the invention, the relatively high-frequency vibration oscillations produce hydrodynamic fields of the smallest magnitude and of a stationary nature; the work-pieces (for example the conductor-boards) move forcibly and rapidly in a pulsating manner about a fixed rest position. The electrolyte exchange caused by vibration on the also concave upper surface of the work-pieces (i.e., on the boundary of the electrochemical two-phase system) is incomparably more effective than any other known process by which relative movements can be obtained.

According to the invention, the work-pieces vibrate with a phase displacement in the oscillation direction of their carriers; accordingly, backward periodic changes of the relative velocities take place between the surfaces (in particular inside narrow drilled holes) of the work-pieces and the adjacent electrolyte. Any cavities in the surfaces of the work-pieces are forcibly wetted.

The most common cause of porosity in electrolytically-deposited layers is known to consist in the adhesion of gas bubbles to the cathode. Experience shows that within a short while, by electrolysis, the cathode surface can become covered by a thick film of hydrogen bubbles, which, however, disappear immediately the vibration oscillations according to the invention are commenced. The metal layers deposited according to the invention have extraordinarily few pores.

The increase of the current density (to five or six-times) with increasing vibration intensity allows an improved electrolyte exchange in the boundary layer to be achieved.

Similar effects also occur in the electrolytic treatment of pourable mass parts in a horizontal rotating dipping drum with perforated walls.

If the known rotational movement of a dipping drum is additionally enhanced by the vibrational oscillations according to the invention, then the relative speed is equally increased of all the individual mass parts of the load both, for the electrolyte enclosed in the load as well as in the electrolyte surrounding the load.

The same useful effect is obtained also with all workpieces with narrow tube-like depressions, blind holes, etc. Similar effects are not obtainable with equipment according to the present state of the art, because the fluid pressure inside concave hollows is not sufficient to remove air or hydrogen bubbles nor to bring about an effective electrolyte exchange.

The effective increase of the electrolyte exchange by the process according to the invention will now be examined numerically through actual examples.

If, in accordance with the general state of the art, a work-piece is moved with a frequency of 16 oscillations per minute and an amplitude of 12.7 mm, then its average relative speed against the surrounding solution amounts to 0.81 m/minute. If the same work-piece oscillates with a pulsating vibration according to the invention with a frequency of 30 Hz and an amplitude of 1.5 mm longitudinally, then its relative velocity with respect to the surrounding electrolyte increases to 10.8 m/sec; the electrolyte exchange thus becomes intensified to about thirteen times at its active phase-boundary.

As a further example, consider the case of the relative rotational movement of work-pieces in a dipping drum of hexagonal cross-section with a width over the flats of 180 mm, which rotates at a speed of 8 turns per minute about its horizontal axis. The average relative speed of the mass parts decreases inside the load-conglomerate proportionally to the distance from the enclosing surface, converging towards zero at the center of the load.

If the drum load (without allowing this to rotate) is caused to vibrate at 30 oscillations per second with an amplitude of 1.5 mm, then the relative velocity of the whole load, that is, all of the mass parts, increases to 10.8 m/minute, or to about two-and-a-half times relative to the condition of the conventional rotation of 8 turns per minute.

A particularly preferred embodiment of the invention foresees combining the known movement system for work-pieces in treatment solutions and that according to the invention, in order to achieve a maximum efficiency.

If, for example, the previously mentioned known linear oscillating movement (with a frequency of 16 oscillations per minute and an amplitude of 12.7 mm) is superimposed on a vibration oscillation according to the invention (with a frequency of 10 Hz and an amplitude of 1.5 mm), such that the work-pieces move through the electrolyte simultaneously under the combined influence of the two movement systems, then the resulting relative velocity is increased to 193.5 mm/sec, or to about fourteen times that of the present state of the art. In spite of the extraordinary increase of the relative velocity, no increased movement path is required: the combined, intersecting to and fro movement takes place between the two turning-points of the path of the original movement system.

In order to arrive at the optimum operational condition for large-area flat conductor boards with drilled holes, it is advantageous that their planes should lie effectively perpendicularly to the direction of their paths of movement. This disposition ensures an almost laminar streaming of the electrolyte through the drilled holes in the boards with the least mechanical resistance to the streaming and the highest speed in the critical region of the walls of the holes.

If one turns to the second previously-mentioned example of a drum as the work-piece carrier which is rotated periodically, then the resulting simultaneous combination of the known rotating movement (of 8 rotations per minute) with the vibration oscillation in accordance with the invention (of 30 Hz with an amplitude of 1.5 mm) leads to a general increase in the relative speeds of all the parts of the mass load. The increase reaches a maximum value of 250 mm/sec in the region of the outer surface of the load (which means an increase of about three-and-a-half times as compared with the original relative speeds) and least values of about 160 mm/sec in the core of the load (against approximately zero previously).

The work-piece carrier for a load comprising a pourable mass of parts is a so-called dipping drum of polygonal cross-section with perforated walls, which rotates about its effectively horizontal longitudinal axis. The drum cylinder is a container closed on all sides and has a closable opening with a removable cover for loading and removing the drum load. The movement paths of the additional vibration oscillations according to the invention preferably occur in planes perpendicular to the axis of rotation.

If it happens that a work-piece carrier (in particular a drum-carrier) is used for the surface treatment of parts in an existing installation which is not fitted with the necessary devices for the vibration oscillation, the vibration producer and its motor-drive can be arranged on the work-piece carrier.

The movement paths of the oscillations can be of multiple geometrical form. If, for example, conductor boards are treated vertically in a bath solutions, then those movement paths may run horizontally; if on the other hand the boards lie horizontally, then the paths may be arranged vertically. The geometrical spaceform of the movement paths will usually be linear; but in general this will depend on each particular embodiment. A preferred form of the invention utilizes a so-called stationary free-running (circular) oscillator. The oscillating system, which includes the work-pieces to be treated and their carriers, circulates around a flat path (in a radial plane) with a constant radius and angular velocity about its stationary, rest position.

The oscillating system, in the case of a drum assembly, is made up in effect from a dipping drum with its support structure, and in addition from the oscillation-generator fixed rigidly on the support structure and from the load contained in the dipping-drum. In the case of a so-called rack assembly, the oscillating system is similarly assembled from a vertically or horizontally disposed frame for the attachment of mostly flat work-pieces each of a large area, from their support structure, as well as from the oscillation-generator rigidly mounted on the support structure. The vibrating systems may be supported on oscillation-dampers, which in turn are arranged either on a flat support frame for the element-groups of the dipping drum or preferably on a support beam for each of the racks. By means of the support frames or the support beams, the work-pieces can be transported as functional units, thus as dipping drum assemblies or rack-assemblies from one treatment station of an installation for the surface treatment to the next. The oscillation-dampers can also be arranged to be stationary, that is, in fixed positions on the edge-stiffenings of the baths of the various treatment solutions, on which the transportable units of the dipping drum or rack system are mounted. The invention also foresees the oscillation-generator being placed between the oscillation-dampers.

The oscillation system of the dipping drum or of the rack, with the inclusion of the work-pieces arranged thereon, has a total mass center of gravity. Advantageously, the oscillation forces act in a plane which either contains the center of gravity or extends through the immediately surrounding space region. The same holds equally for a case where multiple oscillation-generators are used and which act together, and also obviously for the mostly vertical radial planes of a free-running (circular) oscillation-generator. A preferred embodiment of the invention foresees the use of circular oscillations of higher frequencies produced by the oscillation-generator and the use of a lower frequency with a dipping drum, combining these in such a way that they act in opposite directions. This mode of operation aims at a drastic reduction in the amount of rotation, in order to protect as far as possible sensitive work-pieces, such as transistors, for example, from mechanical damage.

Reference will now be made to the accompanying drawings showing apparatus for performing the process of this invention. The following description and accompanying drawings are intended to give a limited representation of the essentials of the process and apparatus of this invention; known construction elements familiar to the expert will not be discussed further here.

Figures 1, 1A:
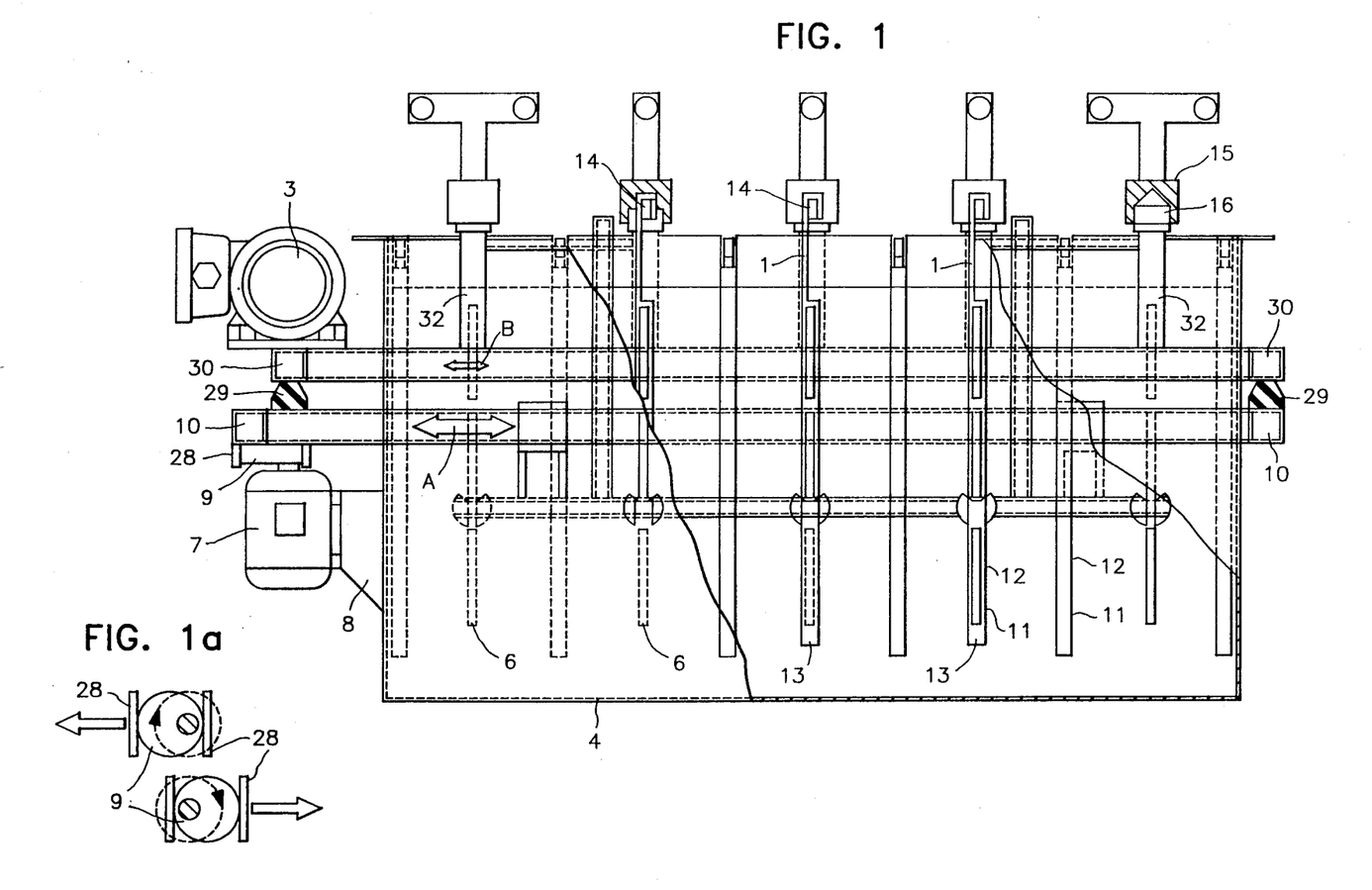
FIG. 1 is a longitudinal section cross-sectional view of an embodiment of an electrolyte-filled bath of an installation for the surface treatment of conductor-boards with printed circuits and the combination of the vibration-oscillations in accordance with the invention with a horizontal movement device according to the state of the art.
FIG. 1a is a schematic cross-sectional view taken along line a—a in FIG. 1.
Figure 2:
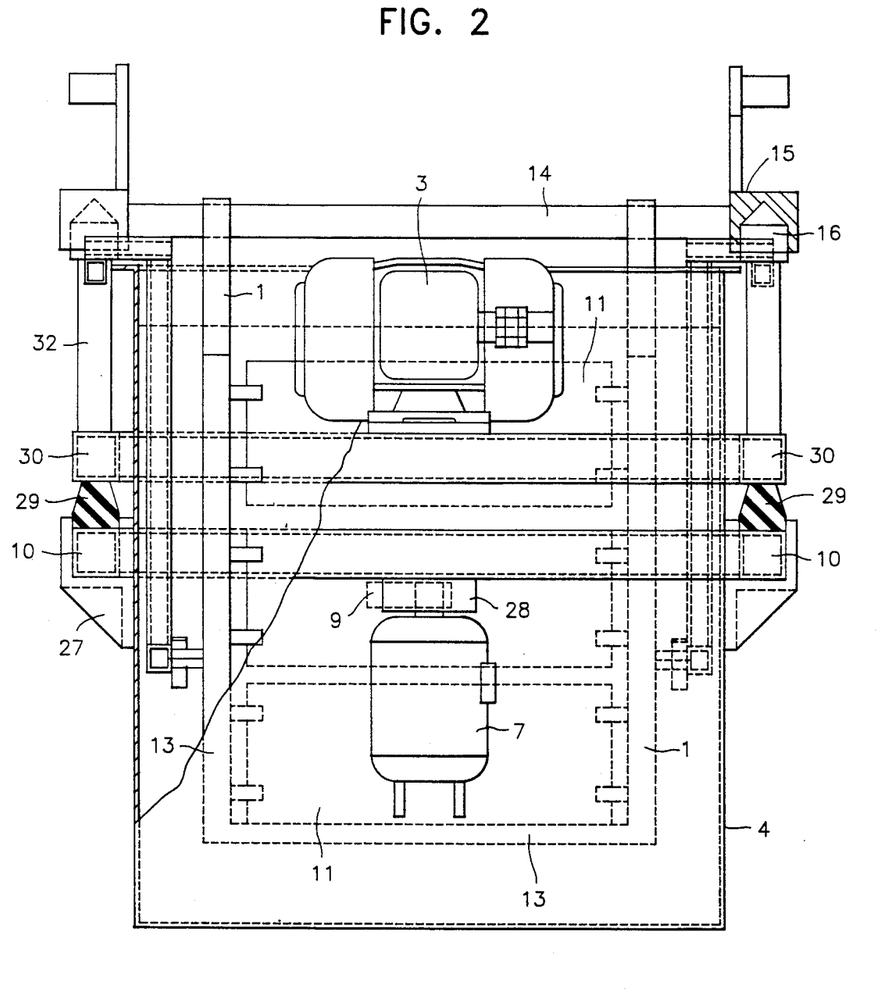
FIG. 2 is an enlarged cross-sectional view through the embodiment according to FIG. 1.

Referring initially to FIGS. 1 and 2, there are shown mainly flat boards 11 consisting of insulating materials on which are drawn a network of electric conductor paths in the form of thin metal strips, as so-called printed circuits. Principal parts of the printed circuits are the generally double-sided plated conductor boards 11. The circuit systems located on the two sides of each board are electrically connected by through-holes 12.

The walls of the bores, after sensitizing with a solution of tin chloride or palladium salts are copper-plated without current in a copper-reduction solution, and then galvanically strengthened to about 2.5 to 5 $\mu$m in an acid copper electrolyte. After this there follows an electrolytic copper-plating of the conductor-tracks to about 20 $\mu$m thickness, so as to arrive at a minimum layer thickness in the bores of 15 $\mu$m. A copper layer as even as possible must be deposited in the bores, in order on the one hand to provide at all places the required minimum layer thickness and on the other hand to avoid excessive fitting tolerances because of increased deposits at the corner edges of the bores. In a further surface treatment, electrolytically-deposited coatings, for example of tin-lead or other metals, may be applied.

A rapid change is forced to take place in the relative velocities of the conductor boards and the electrolyte surrounding them, by rapidly occurring pulsating vibration oscillations, according to the invention, which produces forced flows through the holes. The forced electrolyte exchange at the walls, and also in very narrow and long drilled holes, continues effectively to their critical middle regions. If the vibration-oscillations according to the invention are combined with the conductor-board movement according to the state of the art, then the relative velocities of both systems add and subtract, depending on the movement direction and position of the conductor boards (within the two turning points of the relatively long movement paths). The successive abrupt increases and decreases of the resulting relative velocities pump the treatment solutions variably and continuously into the drilled holes from both ends.

FIGS. 1 and 2 show a tank 4 of an installation for the electrolytic strengthening of drilled holes 12 already chemically through-plated, and the current paths on the conductor board 11. Each conductor board 11 is located between two anode rows 6.

The conductor boards 11 are hung on a carrier (rack) 1 and are transported therein through the whole installation. At both ends of the carrier horizontal beam 14, two vertical arms are provided. One arm has a T-formation at its upper end, in order to form a connection for the carriage of an automatic transport device. The vertical arms as well as the beam of the carrier are fastened together by a cube with a cone-shaped recess, which fits as a support 15 to the cone-shaped carrier-recess 16.

The movement of the conductor boards 11 in the tank occurs horizontally, in effect through the combination, according to the invention, of the following two movement systems:

1. A motorized drive of a movement-system according to the state of the art, in which an electric motor 7 is provided, which by means of a bracket 8 is firmly attached to the tank 4. A circular disc 9 is mounted eccentrically on the shaft of the motor 7.

A horizontal rectangular frame 10, made from square-section tube, surrounds the tank 4 on all sides and is slidably carried on four brackets fastened to the tank 4. On one side of the frame 10 there are provided two vertical plates 28, which lie on opposed sides of the eccentric disc 9 as more clearly shown in FIG. 1a.

If now the motor 7 is rotated, the frame 10 is displaced in the lengthwise direction of the tank 4. The rotational speed of the motor 7 determines the frequency with which the frame 10 performs a horizontal linear to-and-fro movement, and the eccentricity of the disc 9 determines the amplitude. The course of the movement takes place according to a sine-curve.

Typically the frequency, according to the present technique, may be 30 oscillations per minute and the amplitude may be assumed to be 15 mm.

2. On all four corners of the rectangular frame 10, four cylindrical oscillation-dampers 29 are arranged, on which a second rectangular frame 30 is mounted. On one of the sides of the frame 30 an oscillation generator 3 is mounted, able to set the frame in vibration.

Figure 3:
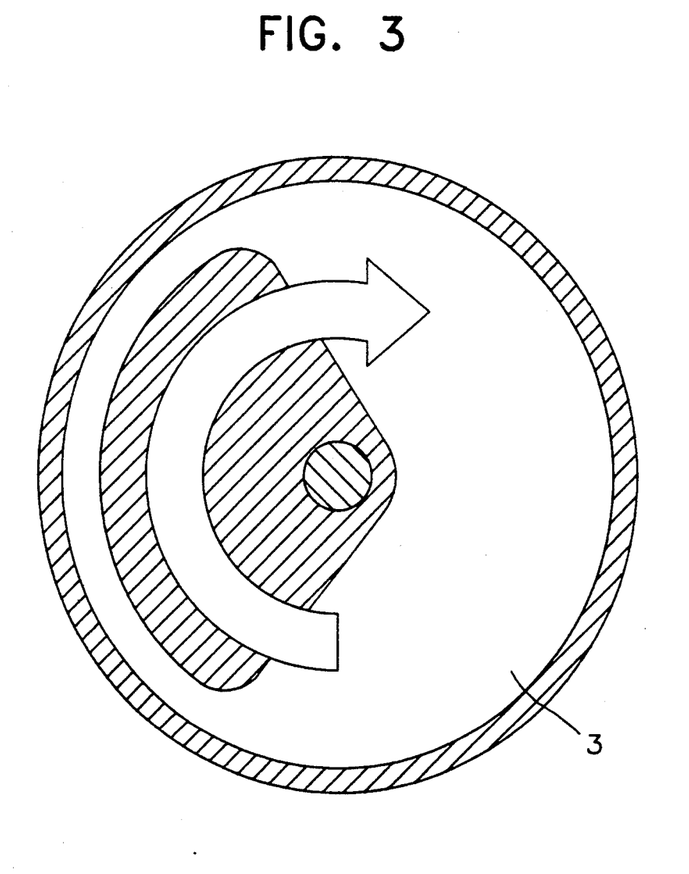
FIG. 3 is a cross-sectional view through the motor showing the functional mode of action of a free-running motor for the production of the vibration oscillations in accordance with the invention, for the installation shown in FIG. 1.

Such an oscillation-generator 3 can be an operating out-of-balance vibrator, as shown in FIG. 3. The rotor has an eccentric center of gravity and is mounted eccentrically on the shaft of an electro-motor so that the out-of-balance forces are transferred directly to the frame 30 which is to be vibrated. The dampers 29 consisting, for example, of a rubber material, have the property of absorbing resiliently the oscillations of the frame 30 and thus keeping the frame 10 entirely free from vibrations.

The out-of-balance forces can be reduced from a maximum value to zero; the intensity of the oscillations transmitted to the frame 30 can therefore be continuously controlled.

FIG. 3 illustrates schematically the way the out-of-balance vibrator 3 represented in FIG. 1 operates.

Along the tank 4, three pairs of vertical support columns 32 are mounted oppositely and equally spaced on the frame 10, in order to receive racks 1 with the conductor boards dipping in the electrolyte.

Let the frequency of the oscillations applied to the conductor-boards 11 be assumed to be 30 Hz, with an amplitude of 1.5 mm. The vibrations will be transmitted from the oscillation-producer 3 over the frame 30, the columns 32 and the rack 1, to the conductor-boards 11.

The larger arrow A drawn on the rectangular frame 10 (FIG. 1) represents the to-and-fro movement according to the known technique; the smaller arrow B on the frame 30 on the other hand represents the vibration oscillations according to the invention. In the essentially straight-line movement paths of the two types of movement, they run perpendicularly to the planes of the large-area conductor boards 11, and are therefore directed parallel to the long axes of the holes 12 in the boards 11.

Figure 4:
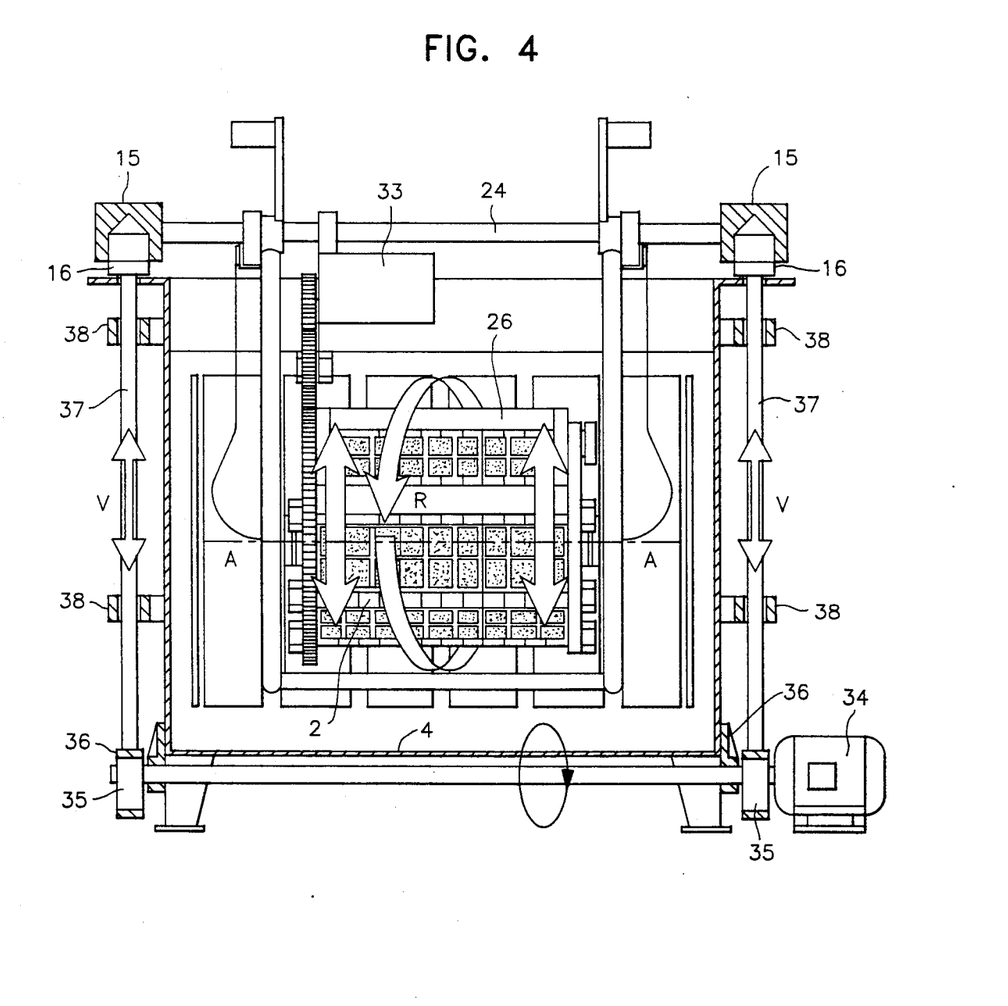
FIG. 4 is a longitudinal cross-sectional view of an electrolyte-filled bath of an installation for the surface treatment of mass parts in horizontal rotating dipping drums, which perform vibration oscillations in vertical directions in accordance with the invention.
Figure 5:
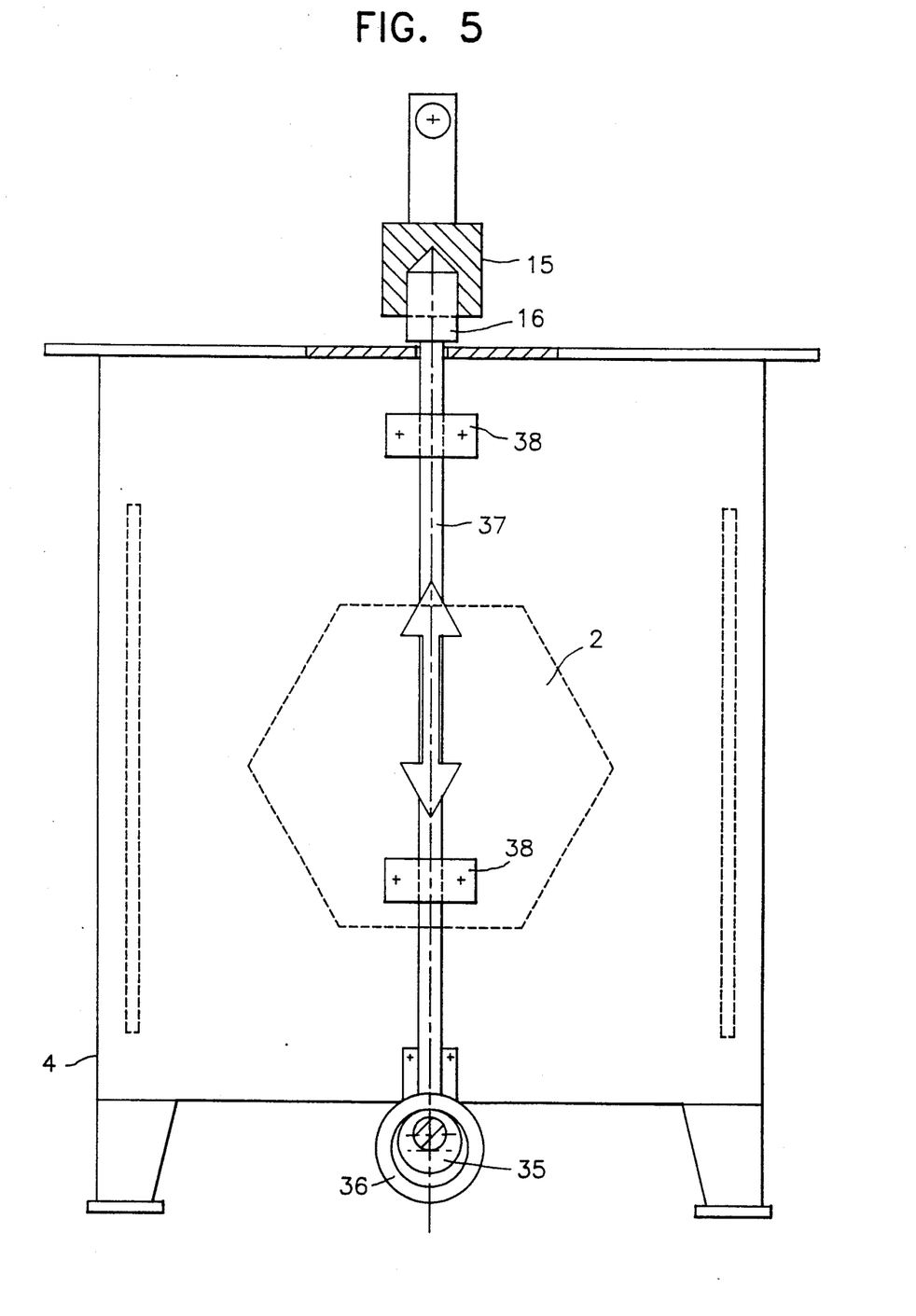
FIG. 5 is a cross-sectional view of the apparatus shown in FIG. 4.
Figure 6:
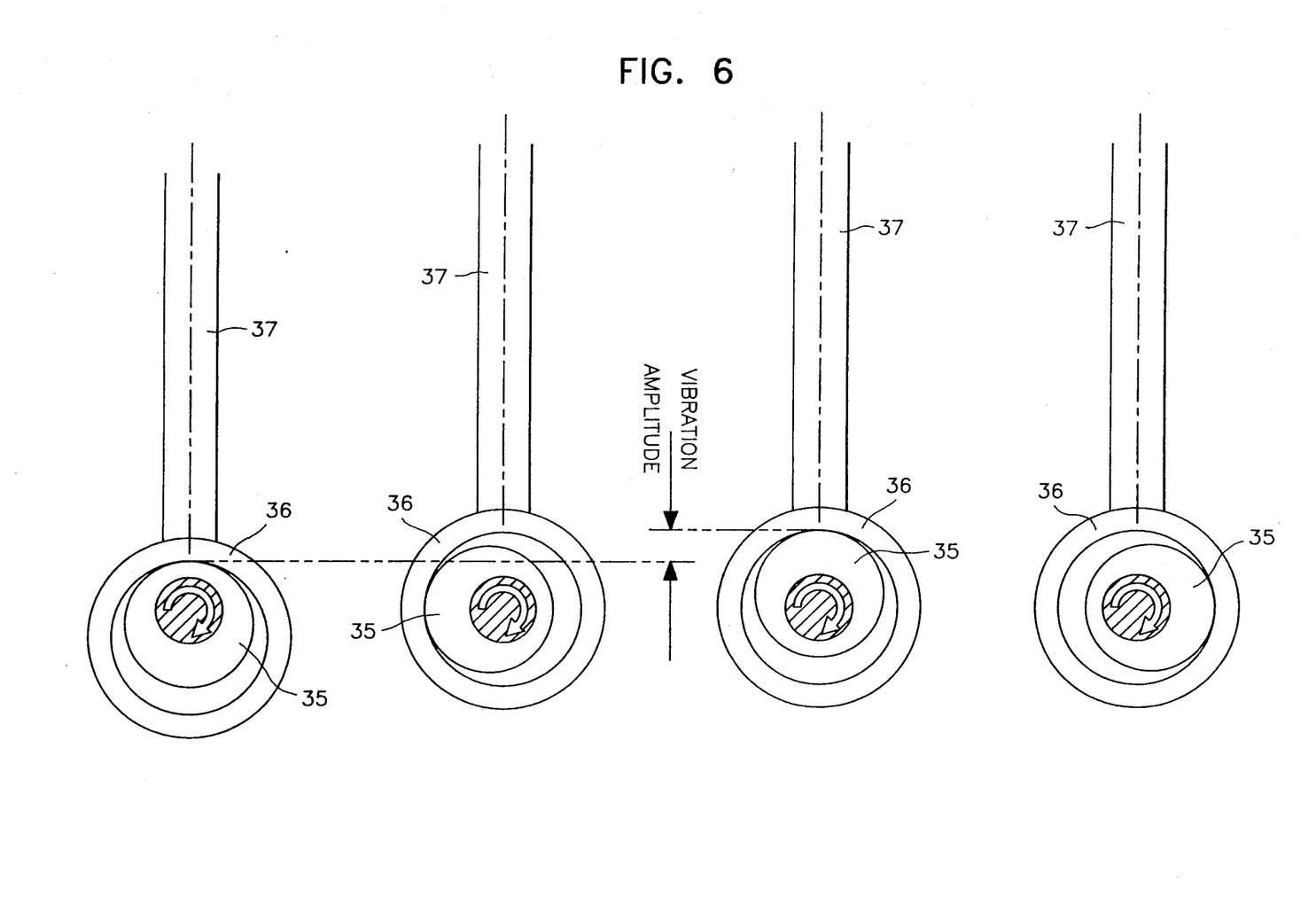
FIG. 6 is an enlarged schematic view which represents functionally the motor-drive for the production of vibration oscillations in the embodiment of FIG. 4.

FIGS. 4, 5 and 6, show an application of the combined movement system in accordance with the invention, as applied to a hexagonal dipping drum 2.

The drum 2 rotates about its horizontal axis A—A in the tank 4 which is filled with electrolyte. The drum-cylinder 2 is closed with a removable cover 26, in order to allow the filling or emptying of the load to be treated. On the support structure 23 of the drum 2, a direct-current motor 33 is arranged to impart rotational movement to the drum.

The drum 2 is provided with a cross-beam on which it is suspended and to each of the two ends of which a support (a conically recessed cube) is fastened. The two supports rest on the two prepared (conically-pointed cylindrical) receivers fitting exactly therewith.

The device for the production of oscillations according to the invention is firmly arranged outside the tank 4.

An electro-motor 34 is provided to drive the oscillation system. A straight extension shaft of the motor-shaft is coupled thereto, lying below the tank 4. The shaft is journalled in bearings: to its two ends are fastened respective eccentric discs 35.

Two rings 36 are carried by the discs, the inside diameter of each ring being sufficiently large to allow the respective eccentric disc 35 to rotate therein, so that the ring 36 can move up and down in the vertical direction. Each ring 36 is located at the lower end of a vertical rod 37, to the upper end of which a recess for the drum support structure is arranged. Each rod 37 slides vertically up and down through two bearings 38 mounted on the tank 4.

FIG. 6 illustrates the mechanism by which the vibration oscillations according to the invention in the present example are produced. The motor 34 turns the shaft with the eccentric discs 35, so driving the rods 37 in rapid sequence up and down. The cylindrical carrier-receptacle which oscillates with the rods transfers the movement to the dipping drum hanging therefrom.

The strongly vibrating dipping drum in turn transfers the oscillations to a load 21 contained therein.

The rotational movement of the drum 2 is indicated by the arrow R, and the alternating vibration oscillations are indicated by the double arrow V. According to the invention, the individual mass parts of the load 21 execute resultant movements, of which the two components are the known rotational movement and the vibration oscillation according to the invention.

Figure 7:
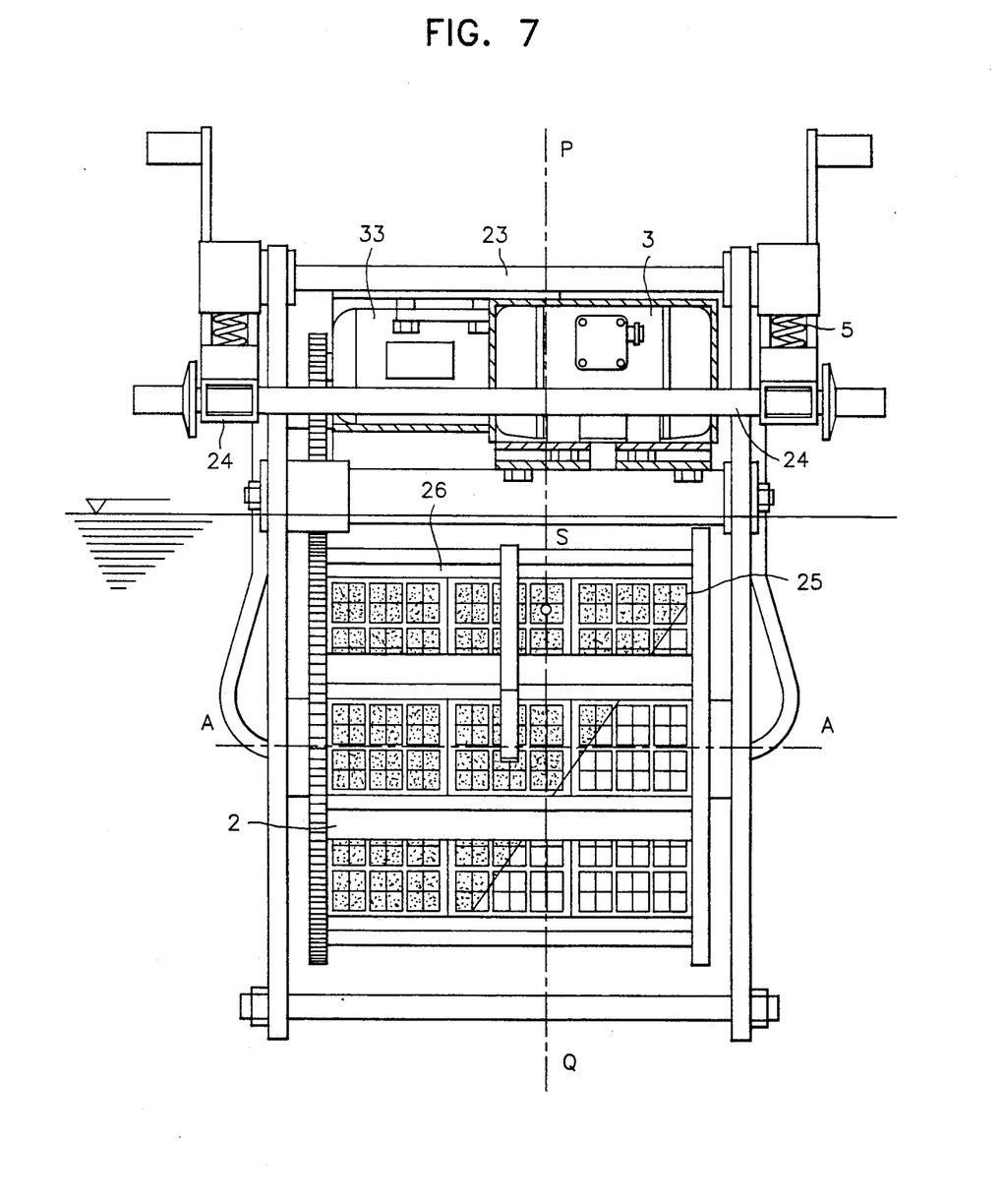
FIG. 7 is a cross-sectional view of a transportable drum-assembly with an integrated oscillation-generator.
Figure 8:
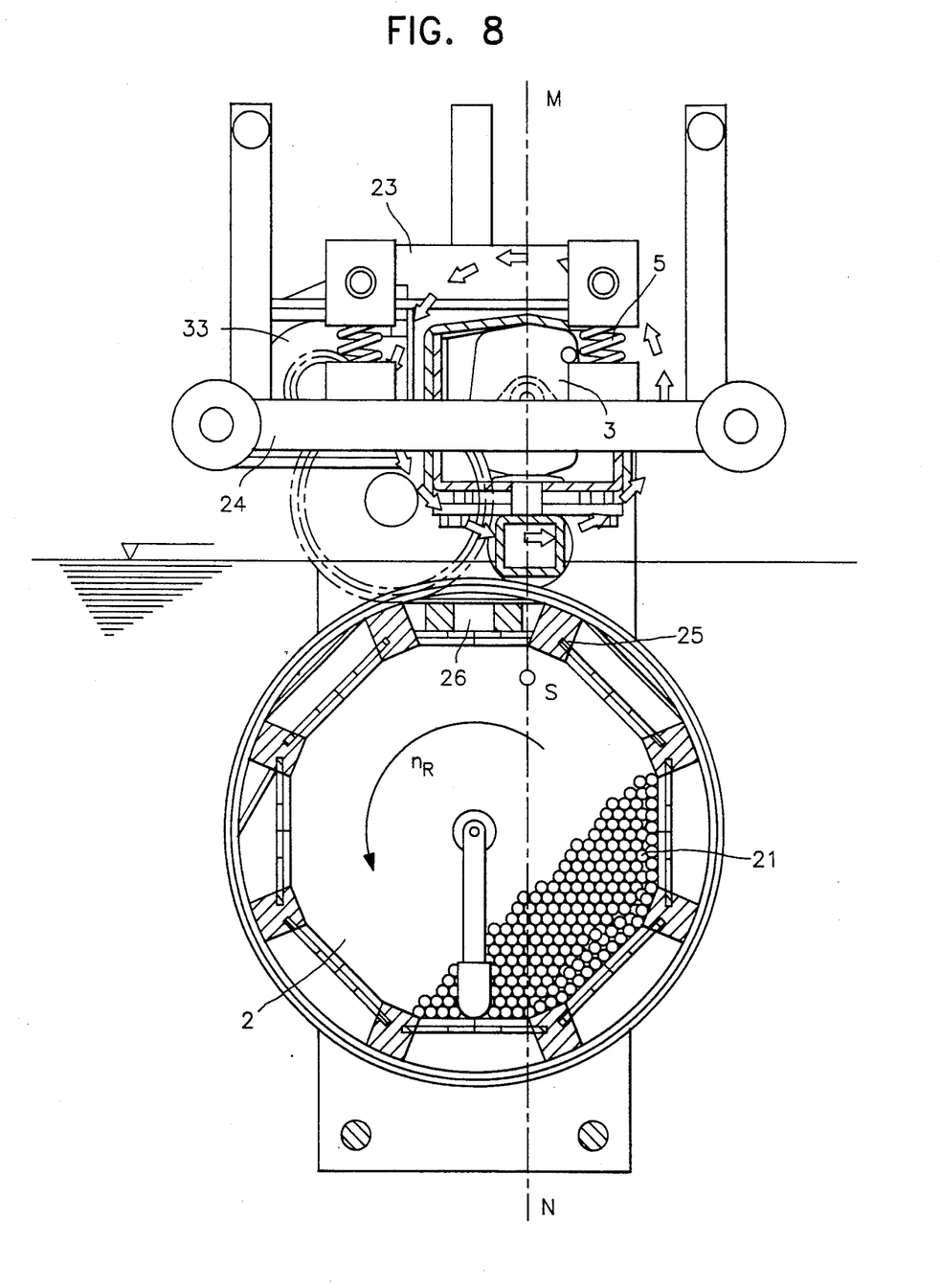
FIG. 8 in a cross-sectional view which represents the drum-assembly of FIG. 7.

The associated FIGS. 7 and 8 show a dipping drum assembly in a particularly preferred embodiment of the invention. The dipping drum 3 and the load 21 contained therein are fitted into a transportable unit which is capable of functioning independently, which, with an integrated oscillation generator 3, is transported from one treatment installation for the surface treatment to the next by the transport mechanism of the installation. The fully closed dipping drum 2 rotates about its horizontal long axis A—A. The cover 26 closes the opening of the dipping drum 2 for loading or unloading the charge 21.

The oscillating element-group with the dipping drum 2 and the free-running vibrator 3 is carried on shock-absorbers comprising helical springs 5.

The center of gravity S of the whole mass of the vibrating system is located in the vertical section of the plane through the points M-N and P-Q. The section goes through the stationary rest position of the oscillating system. The circular-frequency of the unforced vibrator 3 is characterized by the letters $n_V$ and the rotation frequency of the dipping drum 2 by $n_R$.

Instead of the use of a dipping drum 2 as used in the embodiment of the invention shown in FIGS. 7 and 8, a rack 1 with, for example, boards 11 with conductors for printed circuits may equally be employed.

I claim:

1. A process for the continuous exchange of aqueous solutions on workpieces each having at least one planar surface during chemical or electrolytic surface treatment of the workpieces comprising:
   immersing the workpieces in a treatment solution;
   displacing said workpieces by a first repetitive movement in a plane substantially perpendicular to at least one planar surface of the workpieces at a frequency of less than 1 Hz and an amplitude in the range between substantially 10 mm and 150 mm; and
   oscillating said workpieces by a second movement in substantially the same direction as said first movement at a frequency in the range between substantially 1 Hz and 30 Hz and an amplitude of less than 10 mm, so that said separate movements produce a resultant combined movement of said workpieces relative to the treatment solution.

2. The process as claimed in claim 1 wherein:
said first and second movements are simultaneous.

3. The process as claimed in claim 1 wherein:
said oscillation of said second movement has a frequency of substantially 25 Hz and an average pathlength of the corresponding amplitude of less than 2 mm.

4. The process as claimed in claim 1 and further comprising:
   supporting said workpieces on a carrier; and oscillating said carrier.

5. The process as claimed in claim 4 wherein said workpieces are in the form of planar articles having flat surfaces and further comprising:
   rigidly attaching said workpieces to said carrier; and
   oscillating said carrier in a direction substantially perpendicular to the planes of said workpieces.

6. The process as claimed in claim 1 wherein:
said workpieces are discrete pourable articles;
said method further comprises partially filling a perforated rotatable drum carrier with a bulk charge of said discrete articles;
said first movement comprises rotating said drum about the axis of rotation thereof to stir said workpieces; and
said second movement comprises oscillating said drum.

7. The process as claimed in claim 6 wherein:
said second movement comprises oscillating said drum in a direction substantially perpendicular to said axis of rotation of said drum.

8. The process as claimed in claim 4 wherein:
said oscillating comprises displacing said carrier substantially linearly in a substantially vertical direction.

9. The process as claimed in claim 4 wherein:
said oscillating comprises displacing said carrier substantially linearly in a substantially horizontal direction.

10. The process as claimed in claim 4 wherein:
said oscillating comprises displacing said carrier in a substantially circular oscillation in a path lying in a plane.

11. The process as claimed in claim 6 wherein:
said first and second movements are in intersecting paths.

12. The process as claimed in claim 6 wherein:
said first and second movements are simultaneous.

13. The process as claimed in claim 4 comprising:
producing said second oscillating movement by an oscillation generator and producing a force by said oscillation generator directed substantially through the center of gravity of the total mass of said workpieces and said carrier.

14. Apparatus for effecting a continuous exchange of aqueous solutions on workpieces each having at least one planar surface in a chemical or electrolyte treatment of said workpieces comprising:
   a tank for containing a treatment solution;
   carrier means for supporting workpieces immersed in said treatment solution;
   first displacement means for displacing said workpieces in a repetitive movement relative to said tank and treatment solution in a plane substantially perpendicular to said at least one planar surface of said workpieces at a frequency of less than 1 Hz and an amplitude in the range between substantially 10 mm and 150 mm; and
   second displacement means for separately and independently oscillating said workpieces relative to said tank and solution in substantially the same direction as said first displacement at a frequency in the range between substantially 1 Hz and 30 Hz and an amplitude of less than 10 mm, so that said first and second displacement means produce a resultant combined movement of said workpieces relative to said tank and treatment solution.

15. Apparatus as claimed in claim 14 wherein:
said first and second displacement means are operatively connected to said carrier for displacing said carrier in separate movements simultaneously.

16. Apparatus as claimed in claim 15 wherein said workpieces are substantially planar in shape and:
   said carrier means comprises a rack assembly for supporting a plurality of workpieces in substantially parallel relationship; and
   said first and second displacement means move said rack assembly so that said workpieces are moved in a direction substantially perpendicular to the planes of said workpieces.

17. Apparatus as claimed in claim 15 wherein:
said first displacement means comprises a first frame assembly surrounding said tank, first motor means, and rotatable cam means connected to said first motor means for rotation thereby and engaging said first frame assembly so that rotation of said cam means oscillates said first frame assembly; and
said second displacement means comprises a second frame assembly surrounding said tank, second motor means mounted on said second frame assembly and having an output shaft, and rotor means having an eccentric center of gravity mounted on said shaft so that rotation of said rotor means by said second motor means oscillates said second frame assembly.

18. Apparatus as claimed in claim 15 wherein:
said first frame assembly comprises a substantially horizontal part; and
said second frame assembly is resiliently mounted on said horizontal part of said first frame assembly.

19. Apparatus as claimed in claim 15 wherein said workpieces are discrete pourable articles and:
said first displacement means comprises a rotatable drum means having a rotational axis and a hollow interior for containing the workpieces, perforated wall means on said drum means, a frame assembly for supporting said drum means in said tank for rotation about said rotational axis thereof, and first motor means operatively connected to said drum means for rotating said drum means; and
said second displacement means comprises a second motor means mounted on said frame assembly and having an output shaft, and rotor means mounted on said shaft for rotation thereby and having an eccentric center of gravity so that rotation of said rotor means by said second motor means oscillates said frame assembly and said drum means in a direction substantially perpendicular to said rotational axis.

20. Apparatus as claimed in claim 14 wherein:
said carrier means, and said first and second displacement means comprise a functional unitary assembly; and
a transportable support means is connected to said unitary assembly for facilitating transporting said unitary assembly between a plurality of treatment stations.

* * * * *